United States Patent [19]
Bar-Gadda

[11] Patent Number: 5,824,604
[45] Date of Patent: Oct. 20, 1998

[54] HYDROCARBON-ENHANCED DRY STRIPPING OF PHOTORESIST

[75] Inventor: Ronny Bar-Gadda, Palo Alto, Calif.

[73] Assignee: Mattson Technology, Inc., Fremont, Calif.

[21] Appl. No.: 590,228

[22] Filed: Jan. 23, 1996

[51] Int. Cl.$^6$ .................................................. H01L 21/302
[52] U.S. Cl. .......................... 438/725; 438/731; 252/79.1
[58] Field of Search ............................. 156/643.1, 646.1, 156/657.1, 659.11; 252/79.1; 437/229; 438/725, 731, 738

[56] References Cited

U.S. PATENT DOCUMENTS

| | | | |
|---|---|---|---|
| 3,951,843 | 4/1976 | Jacob | 252/79.1 |
| 4,462,863 | 7/1984 | Nishimatsu et al. | 252/79.1 |
| 4,511,430 | 4/1985 | Chen et al. | 252/79.1 |
| 4,557,796 | 12/1985 | Druschke et al. | 156/643 |
| 4,618,398 | 10/1986 | Nawata et al. | 252/79.1 |
| 4,673,456 | 6/1987 | Spencer et al. | 156/643.1 |
| 4,678,539 | 7/1987 | Tomita et al. | 252/79.1 |
| 4,711,698 | 12/1987 | Douglas | 252/79.1 |
| 4,857,140 | 8/1989 | Loewenstein | 156/659.11 |
| 4,980,022 | 12/1990 | Fujimura et al. | 156/643.1 |
| 5,037,506 | 8/1991 | Gupta et al. | 156/659.11 |
| 5,057,187 | 10/1991 | Shinigawa et al. | 156/643.1 |
| 5,068,040 | 11/1991 | Jackson et al. | 210/748 |
| 5,227,341 | 7/1993 | Kamide et al. | 437/229 |
| 5,384,167 | 1/1995 | Nishiwaki et al. | 427/569 |
| 5,399,237 | 3/1995 | Keswick et al. | 156/643 |
| 5,451,293 | 9/1995 | Tabara | 437/229 |
| 5,628,871 | 5/1997 | Shinagawa | 437/229 |

FOREIGN PATENT DOCUMENTS

| | | | |
|---|---|---|---|
| 55-064233 | 5/1980 | Japan . | |
| 58-214149 | 12/1983 | Japan . | |
| 63-217629A | 9/1988 | Japan . | |
| 2222468 | 9/1990 | Japan . | |
| WO94/20587 | 9/1994 | WIPO | C09K 5/04 |

OTHER PUBLICATIONS

K. Katayama, et al. "A Study of Highly Selective Oxide Etching by ECR [Electron–Cyclotron Resonance] Plasma," *The Electrochemical Society*, vol. 93, No. 21, (1993) pp. 201–207.

L.P. Andersson et al. "Initial Etching in an RF Butane Plasma," *Journal of Vacuum Science and Technology*, vol. 28, No. 10/11 (1978) pp. 449–451.

L.A. Pederson et al. "Structural Composition of Polymers Relative to Their Plasma Etch Characteristics," *Journal of the Electrochemical Society*, vol. 129, No. 1, Jan. 1982, pp. 205–208.

K. Hirose et al. "Ion–Implanted Photoresist and Damage-–Free Stripping," *Journal of the Electrochemical Society*, vol. 141, No. 1, Jan. 1994, pp. 192–205.

M.C. Peignon et al. "A Kinetic Study of Reactive Ion Etching of Tungstein in $SF_6\backslash O_2RF$ Plasmas," *Journal of the Electrochemical Society*, vol. 140, No. 2, Feb. 1993, pp. 505–512.

H. Namatsu et al. "Hydrocarbon–Oxygen Mixture as a Resist Etching Gas with Highly Anisotropic Etching Feature," *Journal of Electrochemical Society*, vol. 100, No. 2, Feb. 1983, pp. 523–525.

P. Singer et al. "Plasma Etch: A Matter of Fine–Tuning," *Semiconductor International*, Dec. 1995, pp. 65–68.

*Primary Examiner*—Robert Kunemund
*Assistant Examiner*—Anita Alanko
*Attorney, Agent, or Firm*—Wilson Sonsini Goodrich & Rosati

[57] ABSTRACT

Means for increasing the selectivity of photoresist stripping to oxide etching are disclosed. A plasma of an oxidizing gas, a fluoride-containing compound, and a hydrocarbon contains reactive species that preferentially strip photoresist from a substrate with little etching of oxide on the substrate's surface when the reactive species contact the substrate. The reactor, compositions, and methods disclosed are particularly useful in processes for etching silicon wafers to form semiconductor or microelectromechanical devices.

41 Claims, 2 Drawing Sheets

Fig. 1

HYDROCARBON-ENHANCED DRY STRIPPING OF PHOTORESIST

BACKGROUND

The current invention relates to an improved method of removing photoresist from a substrate.

During computer chip manufacturing, various materials are deposited onto a silicon wafer to convert the silicon wafer into many functioning computer chips. A bare silicon wafer is usually masked with such materials as silica (silicon oxide or oxide), silicon nitride, and photoresist to protect areas on the wafer during different process steps.

Photoresist is exposed to a number of process steps that change the nature and physical qualities of the photoresist during the time that it is present on a substrate. A simplified discussion of how a semiconductor gate oxide device is formed illustrates how photoresist is used and how its characteristics are changed during use.

To form a semiconductor gate oxide device, a thick layer of oxide is usually grown on the surface of the silicon wafer. Photoresist is spun onto the oxide layer and patterned using ultraviolet light and a patterning mask, and the photoresist is subsequently developed to provide protected oxide areas and unprotected oxide areas. In a commercial process, the photoresist is developed rapidly, which usually traps some of the solvent in which the photoresist was suspended below the cured surface.

After developing the patterned photoresist, oxide is removed from the unprotected areas using reactive-ion etching, for example. Once the desired oxide pattern is established, metal species such as ions, free radicals, other energetic species, or other metal atoms are implanted into silicon underlying the patterned oxide to form the gate in the semiconductor device. Metal species are driven through the oxide and into the silicon to a desired concentration and depth using a selected dose of metal species and high energy, and these species are also unavoidably driven into the photoresist during this process. It has been theorized that these species modify the photoresist by providing sufficient energy to drive hydrogen out of the photoresist and form double- and triple-bonded carbon atoms in the surface layer of the photoresist, creating a hardened crust and making the photoresist difficult to remove.

To complete the semiconductor gate oxide device, the contacts of the device are metalized, and the photoresist is removed from the wafer. It is highly desirable to remove the photoresist with high selectivity and minimal disturbance to the Si, $SiO_2$ (oxide), $Si_3N_4$, metal, and other structural and/or masking materials present on the wafer so that device performance and reliability are ensured and so that further processing of the wafer remains uncomplicated by the resist strip. However, photoresist usually becomes very difficult to remove as a result of the numerous processing steps to which it is exposed. A number of methods have been developed in an attempt to remove this hardened and changed photoresist.

One method of removing photoresist (stripping) is a wet-chemical method as exemplified by Japanese patent application JP 55064233. In this method, a wafer having a photoresist layer is washed with a chlorinated aliphatic hydrocarbon and lower alkanol. The wafer must be washed and dried after stripping the photoresist with the chlorinated hydrocarbon and alcohol mixture, which increases the number of steps required to process wafers and consequently increases the time required to process wafers.

Japanese patent application JP 2222468 also discloses that chlorinated fluorinated hydrocarbons, especially derivatives of butane, are effective stripping agents that are more compatible with plastics than other chlorine solvents.

WO 94/20587 discloses a composition comprising a hexafluoropropane and butane, cyclopropane, isobutane, propane, or dimethyl ether that was designed to replace refrigerant gases known to be harmful to the ozone layer. This composition is also stated to be useful as a stripper for photoresist when used with, e.g., a chlorohydrocarbon such as 1,1,1-trichloroethane or trichloroethylene.

Another method of stripping photoresist from a wafer is a dry method that utilizes the reactive species created in a dry plasma to react with photoresist and strip it from the surface of the wafer. In a commonly-used commercial process, photoresist is removed in two steps. First, a plasma of oxygen and forming gas (a nonexplosive mixture of nitrogen and hydrogen gases) is created, and the plasma products are passed over the photoresist layer on the wafer at a temperature of approximately 150° C. for approximately 5–20 minutes to remove the layer of crust from the surface. This step usually produces only partial removal of the crust. After this first step, a plasma formed from oxygen or a mixture of oxygen and nitrogen is passed over the remaining photoresist layer for 1–2 minutes and at a temperature of approximately 250° C. until as much of the remaining photoresist is removed that can be removed.

This process has numerous shortcomings. The total stripping time for this process is approximately 5 to 20 minutes, depending on how severely crusted and/or implanted the photoresist is. This long stripping time limits production rate and increases the per-wafer cost of production. Also, because of the high temperatures involved in this process, the photoresist can "pop" or bubble. Popping and bubbling can be the result of either of two mechanisms. In one case, solvent that is trapped within the photoresist layer during step of "fixing" the photoresist boils, creating a gaseous high-pressure pocket within the photoresist that breaks the photoresist and spews portions of it at high velocity onto different areas of the wafer ("popping"), thereby damaging or contaminating other parts of the wafer and/or the reactor walls. In a second mechanism, implanted metal species can form volatile species that are trapped below the hardened crust during photoresist stripping. The hardened crust traps most of these volatilized species, and finally the high pressure of this trapped gas breaks the crust and spews portions of the photoresist across the substrate and into the reactor walls. Some of the implanted metal species form a non-volatile oxide instead of a volatile hydride or fluoride, and these oxides can remain on or in the wafer as contaminants which can affect semiconductor device performance, especially when photoresist has popped and essentially implanted the photoresist and/or metal oxides into various locations across the wafer. Also, elemental nitrogen in the plasma can combine with reactive oxygen and/or fluorine atoms, slowing or preventing further stripping. Despite these shortcomings, the above process has found wide-spread commercial use for stripping photoresist from silicon wafers.

Dry stripping processes have not utilized a hydrocarbon to enhance photoresist stripping. However, various hydrocarbons have been used for other purposes. For example, Japanese patent application JP 58214149 discloses a method of developing a photoresist by using a high-frequency plasma of a fluorocarbon or a mixture of a fluorocarbon and inert gas to remove undeveloped photoresist. A journal article also disclosed that oxide had been preferentially removed and photoresist left intact by adding hydrogen gas when dry-etching oxide (see K. Katayama, M. Hisada, S.

Nakamura, & H. Fujiwara, *A Study of Highly Selective Oxide Etching by ECR [Electron-Cyclotron Resonance] Plasma,* THE ELECTROCHEMICAL SOCIETY Proceedings Vol 93–21 (1993)). U.S. Pat. No. 5,399,237 disclosed a method of selectively etching $Si_3N_4$ using, e.g., $CH_3F$ and $CO_2$ during the second stage of a multi-stage process. Another journal article disclosed that butane initially etched substrates such as gold and aluminum and subsequently deposited a layer of carbon on the substrate during plasma-enhanced chemical-vapor deposition of carbon onto the substrates (see L. P. Andersson and S. Berg, *Initial Etching in an RF Butane Plasma,* VACUUM, Vol. 28, No. 10/11 (1978)). U.S. Pat. No. 5,384,167 discloses a method for the surface treatment of a metal substrate such as copper, steel, or aluminum that uses a plasma of a mixed gas comprising an inert gas, such as He, Ar, or Ne, and a reactive gas. The metal substrate is said to be implanted with or coated with another metal in this process. Examples of reactive gases include the preferred gases of carbon-containing compounds, gases of sulfur-containing compounds, and gases of halogen-containing compounds. None of these publications discloses that a hydrocarbon may be useful when dry-stripping or ashing photoresist from a substrate.

It is an object of this invention to provide a process that removes photoresist in less time than prior processes took. It is also an object of this invention to provide a process that requires only one step of contacting photoresist, especially metal species-implanted photoresist, with an oxygen-containing stripping gas to remove the photoresist. It is an additional object of this invention to provide a process that reduces or eliminates popping during stripping. It is a further object of this invention to provide a process that has an improved selectivity of photoresist stripping to oxide etching. Another object of this invention is to provide a means for reducing oxide etch rate during photoresist stripping. These and other objects are apparent from the discussion herein.

SUMMARY OF THE INVENTION

In one embodiment, the invention provides a process for removing photoresist from a substrate comprising forming a plasma of a gas comprising an oxidizing gas, a halogen-containing compound, and a hydrocarbon that releases hydrogen under plasma-forming conditions to generate reactive hydrogen species in the plasma; contacting a substrate having photoresist to be removed from its surface with reactive species from the plasma; and removing at least a portion of the photoresist from the substrate. In another embodiment of the invention, an improved plasma for stripping photoresist from a substrate is provided that comprises a plasma of an oxidizing gas, a halogen-containing compound, and a hydrocarbon that releases hydrogen under plasma-forming conditions to generate reactive hydrogen species in the plasma.

In a further embodiment, the invention provides a process for removing photoresist from a substrate comprising forming a plasma of a gas comprising an oxidizing gas, a halogen-containing compound, and a hydrocarbon that releases hydrogen under plasma-forming conditions to generate reactive species in the plasma; contacting a substrate having photoresist to be removed from its surface and also having oxide on a surface of the substrate with reactive species from the plasma; and removing at least a portion of the photoresist from the substrate.

A process is also provided for removing hardened or metal species-implanted photoresist from a silicon wafer comprising placing a silicon wafer having hardened or metal species-implanted photoresist thereon into the wafer processing chamber of a plasma-generating reactor; forming reactive species in a plasma of a gas comprising oxygen, a fluorine-containing compound, and a hydrocarbon of a type and in an amount that is effective to increase the selectivity of strip rate of the photoresist to oxide etch rate; and contacting the photoresist on the silicon wafer with reactive species from the plasma.

The invention also provides a reactor system for removing photoresist from a substrate comprising a plasma-generating reactor capable of forming a plasma from a gas within the plasma-generation chamber of the reactor and a source of gas used to generate the plasma, where the gas comprises oxygen, a compound that produces atomic fluorine under plasma-generating conditions, and a hydrocarbon that releases hydrogen to form a free-radical under plasma-forming conditions.

Among other factors, the invention is based on the technical finding that a dry process for stripping photoresist using a plasma formed from an oxidizing gas such as oxygen, a halide-containing compound such as $SF_6$, and a hydrocarbon such as isobutane strips the photoresist in a short time, eliminates multiple processing steps, enables operating the process at a low temperature, prevents "popping" the photoresist during stripping, etches oxide at a low rate, and has a high selectivity of photoresist stripping to oxide etching. These advantages and others are apparent from the discussion herein.

DETAILED DESCRIPTION OF THE PREFERRED EMBODIMENT

In one preferred embodiment, the invention comprises a process that removes photoresist quickly without requiring the multiple steps of prior-art processes and without "popping" the photoresist during removal. In this embodiment, a substrate having photoresist on a surface is placed in a plasma-generating reactor, and a plasma is generated from a gas that contains oxygen or another oxidizing gas, a halogen-containing gas, and a hydrocarbon. Reactive species from the plasma cooperate to strip both the photoresist and metal species implanted into the photoresist from the substrate.

It is theorized that many mechanisms cooperate simultaneously to dry-strip photoresist quickly and without "popping" or bubbling the photoresist. It is believed that reactive species in the plasma break and/or soften the hard crust that was formed on the photoresist layer before significant volumes of gases can accumulate in the photoresist layer below the crusted surface and develop the pressure needed to rupture and pop the photoresist. The reactive species in the plasma take many forms. The plasma contains reactive ions, neutrally-charged atomic and molecular free-radicals, and energetic ions, free-radicals, and molecules. Free radicals, ions, and/or energetic species can chemically react with the hard layer. For example, atomic hydrogen and/or other free radicals generated by the hydrocarbon in the plasma can hydrogenate or otherwise react with a hydrogen-deficient crust, and oxygen or other reactive species can react to further soften, break, and/or remove the crust. Also, reactive ions can chemically and/or physically etch or otherwise remove the crusted photoresist. These mechanisms create openings that allow gases to diffuse and escape before significant pressures are built-up in the photoresist and below a crusted surface. The openings also allow reactive species from the plasma to diffuse into the photoresist layer easily and quickly, and enable oxidation of the photoresist to occur at a low temperature (approximately 75° C.) but with rapid removal of the photoresist layer. The low reaction temperature also limits or prevents build-up of pressure from trapped gases during photoresist stripping, preventing popping. Further, the combination of oxidizing gas, halogen-containing compound, and hydrogen-containing compound or hydrocarbon act cooperatively to provide a high photoresist strip rate while reducing oxide etch rate substantially compared to the oxide etch rate for a process without the hydrogen-containing compound or hydrocarbon present but which is otherwise identical. This theory is offered as one explanation of the physical and chemical phenomena occurring and is not limiting of the scope of the invention, which is described in greater detail below.

The substrate may be any material that carries a photoresist on it. The substrate is preferably a silicon wafer that is used to fabricate semiconductor or microelectromechanical devices and like components. When making such devices, photoresist may be spun onto the substrate, or the photoresist may be coated or vapor-deposited onto the substrate.

The photoresist to be dry-stripped from the substrate is an organic polymer that contains hydrogen after the photoresist is applied and fixed to the substrate. Photoresist to be stripped may be a positive photoresist, which depolymerizes in the presence of electromagnetic radiation of the appropriate wavelength, or a negative photoresist, which polymerizes in the presence of electromagnetic radiation of the appropriate wavelength. These photoresists include poly (methyl-methacrylate), 1,4-cis-polyisoprene, poly(chloromethylstyrene), poly(glycidyl methacrylate), novolac resin, a polyimide, and like materials.

The gas used to form a plasma preferably comprises oxygen or another oxidizing gas, a halide-containing gas, and a hydrocarbon vapor. The particular compounds used to form the gas are selected by their ability to form a gas and a plasma at plasma-forming conditions. Preferably, the compounds are combined and added to the reactor as a gas. The oxidizing gas combines with carbon and other atoms from the photoresist layer to form volatile compounds at the conditions present in the reactor. Oxidizing gases include ozone, $SO_3$, $SO_2$, and others that produce oxygen atoms or other energetic or reactive species that oxidize photoresist. When oxygen is used to strip photoresist from a substrate, the volatile compounds that are generated include CO and $CO_2$. Preferably, at least a portion of the plasma formed from the oxidizing gas contains free-radicals such as O• that readily combine with photoresist to produce volatile compounds from the photoresist. The halide-containing gas is preferably a fluoride-containing gas and may itself be an organic compound such as $CF_4$, $C_2F_6$, $C_3F_8$, $C_4F_8$, $C_4F_{10}$, $CClF_3$, $CBr_3F$, or $CHF_3$, or it may be an inorganic compound such as $NF_3$, $F_2$, or $SF_6$. Preferably, at least a portion of the plasma formed from the halide-containing gas contains free-radicals such as F•, Cl•, or Br• that combine with metal species implanted in the photoresist to form compounds that are volatile at the conditions present in the reactor. The hydrocarbon used is one that generates sufficient reactive species to increase the selectivity of the photoresist strip rate to oxide etch rate on a substrate having photoresist and oxide on a surface, that is, increases the ratio of photoresist strip rate to oxide etch rate, when compared to a process that strips photoresist from a substrate under identical conditions but where no hydrocarbon is present in the gas used to generate the plasma. Particularly preferred for this purpose are those hydrocarbons that release hydrogen to form reactive hydrogen species such as a free-radical or hydrogen ion under plasma-forming conditions. The hydrocarbon may be unsubstituted or may be partially substituted with a halogen such as fluorine or with oxygen, nitrogen, hydroxyl, and amine groups. A substituted hydrocarbon, for purposes of this invention, includes such compounds as an organic peroxide, ether, ester, or amide, where substituted atoms are within the carbon backbone. Preferably, the hydrocarbon has from one to twelve carbon atoms, and more preferably has from three to ten carbon atoms. The hydrocarbon is preferably an unsubstituted aliphatic compound. Alkanes are preferred, and isobutane is an especially preferred hydrocarbon. Preferably, the selectivity of photoresist strip rate to oxide etch rate is greater than 500:1, more preferably the selectivity is greater than 1000:1, and a selectivity greater than 2000:1 is especially preferred.

The plasma-generating gas may contain other gases. For example, Ar, $N_2$, or He may be added to the plasma-generating gas discussed above to enhance the photoresist strip rate. When present, these gases are usually added to the plasma-generating gas in an amount equal to approximately 0.25% to 10%, preferably about 0.25–5%, of the oxidizing gas flow rate.

The plasma preferably has sufficient energy that ions are generated in addition to free radicals. Such ions include $H^+$, $C_4H_9^+$, $F^+$, $SF_5^+$, and like ions. Without limiting the invention to this theory, it is believed that ions can enhance the stripping process by helping to break the hardened photoresist surface layer, providing surface sites that react more readily with free radicals and/or ions to form volatile compounds and also providing access to underlying photoresist that is more easily stripped from the substrate. Thus, in a preferred embodiment, the plasma has sufficient energy to form a sufficient quantity of reactive species such as ions that the rate at which photoresist is stripped is increased when compared to an identical process operated to minimize such reactive ions. Sufficient energy can be capacitively and/or inductively coupled into the plasma and/or can be introduced by microwave energy or other means.

The reactor used to strip photoresist from a substrate is a plasma-generating reactor, such as a microwave plasma-generating reactor with a microwave source near the substrate, a parallel-plate reactor with a microwave or RF power source, or a reactor having a helical resonator. Preferably, the reactor is an inductively-coupled plasma-generating (ICP) reactor.

Figure 1:
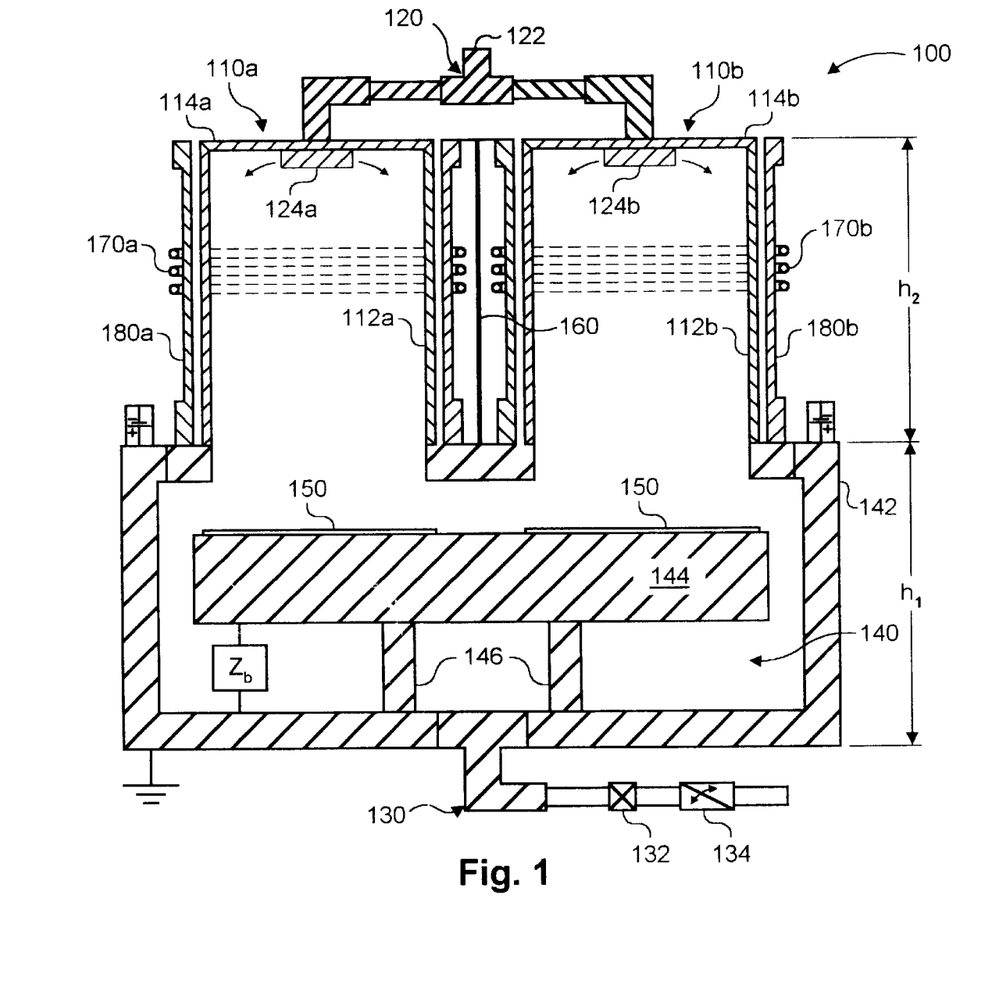
FIG. 1 illustrates a preferred plasma-generating reactor of the invention.

FIG. 1 shows a side cross-sectional view of a preferred dual ICP reactor system 100, in which two essentially identical cylindrical plasma generation chambers 110a and 110b are arranged side by side. Both generation chambers share a gas supply system 120, an exhaust system 130, and a wafer processing chamber 140. This system processes two wafers concurrently to strip photoresist, which doubles throughput.

Referring to FIG. 1, two wafers may be placed in a wafer processing chamber 140 for photoresist stripping. The wafer processing chamber 140 is rectangular and has a height, h1, of approximately 25 cm. The width of the wafer processing chamber is approximately 60 cm, and the depth of the wafer processing chamber measured from the outside of wafer processing chamber wall 142 is approximately 35 cm.

Plasma generation chambers 110a and 110b are situated above the wafer processing chamber and have an outer diameter of approximately 20 cm. The plasma generation chambers are separated by a distance of approximately 28 cm from center to center.

The wafer processing chamber wall 142 is approximately 2.5 cm thick and is grounded. Wafer processing chamber wall 142 provides a common ground for the system, and comprises a conductive material such as aluminum or the like. Within the wafer processing chamber is an aluminum block 144 that acts as a conductive heater or chiller and as a support for wafers 150. From center to center, two 20 cm wafers 150 may be placed approximately 28 cm apart on the aluminum block 144 for processing. The top of wafer processing chamber 140 is approximately 5–6 cm above the surface of wafers 150. A reactor of the present invention may be readily sized for use with wafers of larger or smaller sizes by those skilled in the art.

The aluminum block 144 is positioned on a cylindrical ceramic support 146 and is RF isolated. An element $Z_b$ may be placed between the aluminum block 144 and a ground potential to produce a high impedance of the block to ground at the frequency of excitation, as described in our copending application Ser. No. 08/374,404, filed Jan. 17, 1995, now U.S. Pat. No. 5,534,231, which is incorporated by reference herein in its entirety. The ground potential may be provided by the wafer processing chamber wall 142. This RF isolation allows the potential of the aluminum block 144 to be adjusted to obtain the desired amount and velocity of charged particle current to the surface of wafers 150. The aluminum block 144 is maintained at a temperature that is favorable to the desired reactions at the wafer surface. A heating or cooling unit may be used to heat the aluminum block, although this unit is not shown in FIG. 1 for purposes of clarity.

The aluminum block 144 is usually maintained at a temperature below which popping occurs for the particular photoresist present on the wafer. Preferably the aluminum block 144 is maintained at about 75° C. for most photoresist stripping, including metal species-implanted photoresist removal. This temperature is much lower than the temperature typically required when no hydrocarbon is present during stripping. For example, when oxygen alone is used to strip photoresist, the aluminum block 144 is usually maintained at about 250° C., and a temperature of between 150° C. and 180° C. is usually used for a plasma consisting of $SF_6$ and $O_2$ for removing metal species-implanted photoresist. It has been observed that popping of photoresist is minimized or eliminated in this invention, and it is believed that the reduction in popping results at least in part from a lower substrate temperature. It is theorized that solvent trapped within photoresist does not form high-pressure pockets that explode and spew photoresist at high force over the surface of the substrate and into the reactor's walls because of, among other factors, the lower substrate temperature made possible by this invention.

Below the ceramic support 146 is a gas exhaust system 130. The gas exhaust system 130 may be driven by a conventional fan, pump or similar device. The ceramic support 146 is slotted to allow gases to reach the exhaust system from the perimeter of the aluminum block 144. This system promotes a gas flow radially from the center of wafers 150 to the perimeter of the aluminum block. The gases then flow under the aluminum block through the slots in the ceramic support 146 and to the exhaust system 130. The exhaust system 130 has a shut off valve 132, and a throttle valve 134 is provided for regulating the flow of gases in the exhaust system 130.

Above each wafer 150 is a plasma generation chamber 110a or 110b. The plasma generation chambers have a height of approximately 25 cm and an outer diameter of approximately 20 cm. The generation chamber walls 112 are made of a nonconductive material such as quartz or alumina and have a thickness of approximately 4 to 6 mm. The generation chamber walls 112 are fixed at their base to the wafer processing chamber wall 142 at the top of the wafer processing chamber 140. The top lid 114 of the generation chambers located above the coils is optional and can be aluminum or similar conductive material or can be the same material as the generation chamber walls 112. The two plasma generation chambers 110a and 110b are separated by a conductive partition 160 to prevent any electromagnetic interference between them. In FIG. 1, the partition 160 comprises a thin (approximately 1.5 mm thick) sheet of aluminum. The conductive partition may be an integral part of a safety cage that encloses the generation chambers and the induction coils and prevents radiating electromagnetic interference into the surrounding environment. For purposes of clarity, the safety cage is not shown in FIG. 1.

A gas supply system 120 is provided above the plasma reactor chambers 110. In the center is an input pipe 122 that can be used to provide gases to the plasma generation chambers. A shower head-type nozzle 124 disperses the gas laterally into the plasma generation chambers to enhance uniformity. Typically, oxygen, $SF_6$, and a hydrocarbon will be used simultaneously to strip the photoresist to endpoint (which is determined by the absence of CO emission).

$O_2$ gas or other oxidizing gas is provided at a rate between approximately 1000 and 8000 standard cc per minute per plasma generation chamber through input pipe 122, with 4000 standard cc per minute per plasma generation chamber being typical. The gas supply system 120 and the gas exhaust system 130 cooperate to maintain a flow from plasma to wafer and a pressure in the reactor chamber that promote dissociation of molecules at the selected strength of the induction electric field. Pressures in the range of 0.1–1.5 torr are typically used, and a pressure between 0.1–0.9 torr is preferred. The halide-containing gas and the hydrocarbon are each added continuously in amounts between approximately 0.25–5% of the oxidizing gas flow rate into the reactor. Amounts above 5% may be used but usually are less economical than amounts within the indicated range. The amounts of each gas are typically selected to provide an acceptable strip rate and a selectivity of photoresist strip rate to oxide (i.e. $SiO_2$) etch rate that is higher than when no hydrocarbon is present. When $SF_6$ and isobutane are used, the ratio of isobutane to $SF_6$ volumetric flow rates should be less than approximately 2:1, since stripping essentially stops at this ratio. Preferably, the ratio is approximately 1:1 to provide high strip rate and high selectivity. The photoresist strip rate is preferably sufficient to remove a photoresist layer spun onto a wafer (approximately 1.0 or 1.2–1.5 micron thickness) in less than about 5 minutes, and more preferably less than about 3 minutes, especially when the photoresist has been implanted with arsenic at a dosage level of $1 \times 10^{16}$ atoms/cm$^2$. Oxide etch rate for this invention is preferably less than about 5 Å/min. and more preferably is less than about 3 Å/min.

Induction coils 170, which emit RF energy into the plasma generation chambers, are usually located on the outside portion of the generation chamber walls 112. The induction coils are connected to an RF source through an impedance match network or transformer (not shown). The coils are positioned along the plasma generation chamber to produce plasma that provides approximately uniform ion density to the surface of wafer 150.

For stripping photoresist, inductively-coupled RF power is usually supplied to the reactor at any of the Industry, Scientific, Medical (ISM) standard frequencies of 13.56, 27.12, 40.68 MHz, and other harmonics of the 13.56 MHz ISM standard frequency, but usually the power is supplied to the coils through an impedance match network or transformer at a frequency $f_i$ in the range from 1 to 27 MHz, although lower frequencies may be used to prevent ion drive-in into the substrate to be stripped. RF energy is preferably applied to the induction coil at a power of between 900 and 3000 watts. It is understood that the electric fields generated by the coils are not completely symmetrical and in fact are stronger near the generation chamber wall 112 than in the center of the plasma generation chambers. The electric field and density of the plasma reach a peak in the center of the plasma. A typical value for the peak electric field, E, is approximately 40 V/cm at the point of peak electric field in the reactor chamber, and a typical value for the density of the gas, $N_g$, is approximately $10^{16}/cm^3$ to $10^{17}/cm^3$. $E/N_g$ is preferably no greater than approximately V-cm$^2$, and the peak ion density at the center of the plasma is preferably less than about $10^9/cm^3$ when stripping photoresist.

A split Faraday shield 180 may be used when stripping photoresist, as disclosed in our copending application U.S. Ser. No. 08/340,696, filed Nov. 15, 1994, and which is incorporated by reference in its entirety. When used in this invention, the split Faraday shield is preferably RF grounded through an inductance-capacitance circuit having a variable capacitor, producing a potential difference between the shield and the plasma. The split Faraday shield may also have widened slots that allow capacitive coupling of energy into the plasma from the induction coils to help ignite and sustain the plasma reaction.

Figure 2:
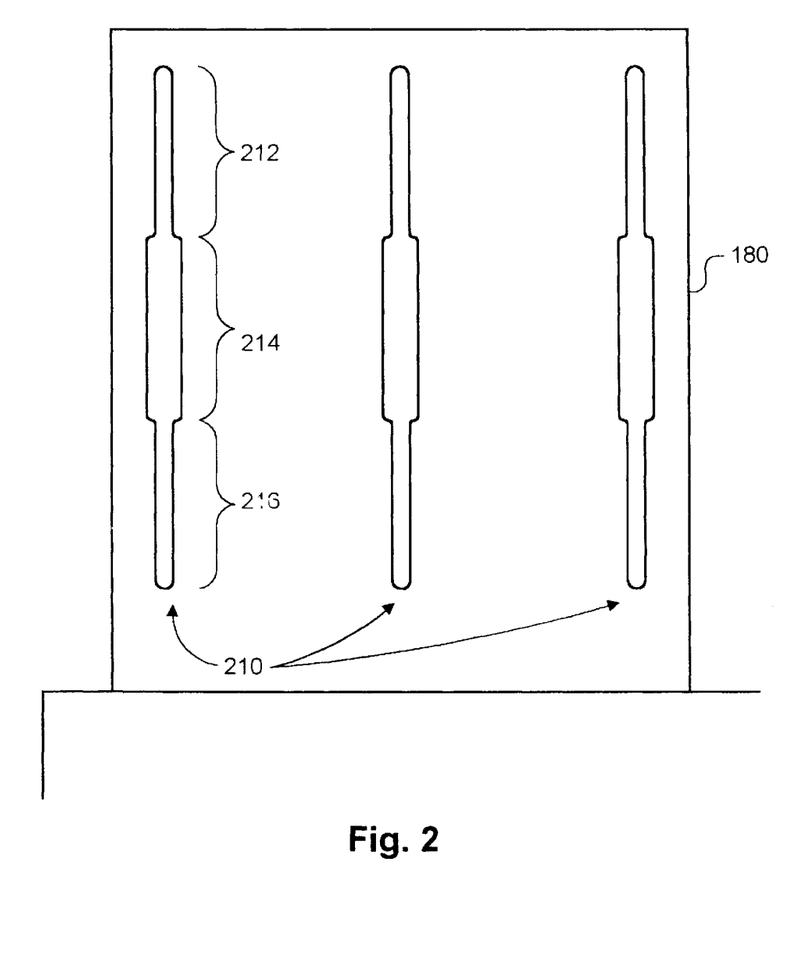
FIG. 2 illustrates one embodiment of a split Faraday shield that can be used in the invention.

The split Faraday shield is interposed between the induction coil and the plasma when used. FIG. 2 illustrates a split Faraday shield 180 for stripping photoresist. This split Faraday shield has vertical slots approximately 20.3 cm long and can be an integral part which simply fits over the plasma reactor chamber. The shield may be located on or slightly away from the walls of the plasma-generating portion of the reactor. The bottom of the split Faraday shield is connected to the inductance-capacitance circuit.

The number and width of slots in the split Faraday shield may be selected to control the level of capacitance coupling and modulation. In one embodiment, the slots 210 in the split Faraday shield 180 start out with a slot width of approximately 0.5 cm in their top portion 212 and widen to approximately 1 cm in the portion of the slot 214 adjacent to the coils. The induction coil 170 preferably surrounds the split Faraday shield in at least the widened portion of the slots. The slots then narrow again to approximately 0.5 cm in a bottom portion of the slot 216. The top and bottom narrow portions of the slots are approximately 6.4 cm long, and the widened middle portion is approximately 7.5 cm long. The slots are usually symmetrically spaced, with adjacent slots being separated by a distance of approximately 8.35 cm apart from center to center when 8 slots are present on the shield. Slots are preferably spaced equidistantly around a split Faraday shield.

Referring to FIG. 1, the split Faraday shield 180 is interposed between the induction coils 170 and the generation chamber walls 112. Preferably, the split Faraday shield is approximately 0.8 cm from the induction coil 170. The split Faraday shield 180 has a width of approximately 3 mm in the section containing the slots 210. The top and bottom portions of the split Faraday shield 180 that do not contain the slots may be even thicker (approximately 1.3 cm thick) to provide a more rigid structure for the split Faraday shield.

When present, the shield is usually connected to an inductance-capacitance circuit having a variable capacitor. The variable capacitor is adjusted to couple sufficient power into the plasma to enhance the strip rate and selectivity of photoresist strip rate to oxide etch rate. The inductance-capacitance circuit provides a means to set or adjust the effective power (power supplied to the inductance coils 170 minus reflected power) to the wafer surface, and when oxygen, $SF_6$, and isobutane are used to strip photoresist from a wafer, an effective power of approximately 1000 watts or more is preferred to provide a high strip rate and selectivity. The amount of effective power is adjusted to provide the desired oxide etch and photoresist strip rates and selectivity. The amount of effective power coupled into the gas on startup is usually greater than the amount of effective power required to sustain the reaction.

The following examples and discussion illustrate particular embodiments of the invention and are not limiting of the scope of the invention.

EXAMPLES

Examples 1–5 and Comparative Examples A and B
Oxide Etch Rate

A process where $SiO_2$ (oxide) etch is minimized during photoresist strip is desirable. The oxide etch rate for preferred embodiments of this invention was compared to the oxide etch rate of a comparative process to determine one of the advantages that this invention can provide.

The method used to determine oxide etch rate is as follows. A thick oxide layer was thermally grown on silicon wafers. Each wafer was placed onto the aluminum wafer support block within an inductively-coupled plasma reactor. The reactor's enclosed volume was purged with oxygen, and the wafer support block was heated to and maintained at 75° C. A plasma-generating gas was introduced into the reactor, and the flow rate, pressure, and reactant concentration as a percentage of oxygen flow rate were varied as shown in Table 1. Comparative Examples A and B utilized a mixture of oxygen and $SF_6$ to generate the plasma, and Examples 1–5 used a mixture of oxygen, $SF_6$, and isobutane to generate the plasma. A plasma was generated by applying 1400 watts of power to the coil at a frequency of 13.56 MHz. The inductor and variable capacitor connected in series with the shield were adjusted first to light-off the plasma, then were adjusted to provide an effective power less than the light-off power, and in many instances the effective power was approximately 1000 watts or greater. Oxide was etched for 180 seconds, and a Thermawave Optiprobe-2600 was used to determine the amount of oxide removed. The results are summarized in Table 1.

TABLE 1

| Example | % $SF_6$ | % Isobutane | $O_2$ Flow Rate (sccm) | Pressure (torr) | Oxide Etch Rate (Å/min.) |
|---|---|---|---|---|---|
| A | 0.33 | 0 | 3000 | 0.376 | 28 |
| B | 0.33 | 0 | 4000 | 0.376 | 34 |
| 1 | 0.25 | 0.25 | 4000 | 0.938 | 2 |
| 2 | 0.33 | 0.33 | 3000 | 0.755 | 3 |
| 3 | 0.50 | 0.50 | 3000 | 0.746 | 5 |
| 4 | 0.50 | 0.50 | 4000 | 0.942 | 2.5 |
| 5 | 1.0 | 1.0 | 2000 | 0.576 | 4 |

These data illustrate one of the advantages of certain embodiments of this invention. The data in Table 1 show that oxide etch rates for Examples 1–5 of this invention were very low and were substantially lower than oxide etch rates for the comparison conditions of Comparative Examples A–B. These data indicate that certain embodiments of this invention remove oxide at a low rate when stripping photoresist, leaving the oxide essentially intact on the wafer.

Example 6 Comparative Example C
Time Required to Strip Photoresist

The following method was used to determine the time needed to strip metal species-implanted photoresist from a substrate for certain embodiments of this invention and for the Comparative Process. A layer of a positive photoresist Megaposit SPR 2–1.0 from Shipley Chemical Company, a novolac photoresist) was spun onto silicon wafers, which were baked to fix the photoresist on the oxide. The thickness of photoresist was not measured, but the process of spinning photoresist onto wafers provides photoresist of sufficiently consistent thickness for purposes of this example. Wafers were then individually implanted with arsenic, boron, or phosphorous at dosage levels of $5\times10^{14}$, $1\times10^{15}$, $5\times10^{15}$, and $1\times10^{16}$ atoms/cm$^2$.

Photoresist stripping was performed under substantially the same conditions as oxide etching in Examples 1–5 and Comparative Examples A–B above. Each wafer was placed onto the wafer support block within the reactor of Examples 1–5 and Comparative Examples A–B. The reactor's enclosed volume was purged with oxygen, and the wafer support block was heated to and maintained at 75° C. A plasma-generating gas was introduced into the reactor, and the flow rate, pressure, and reactant concentration as a percentage of oxygen flow rate were varied to determine the effects of each variable on the time to strip photoresist from the wafer. For the Comparative Process, SF$_6$ was added to oxygen at a flow rate equal to 0.33% of the oxygen flow rate. For this invention, SF$_6$ and isobutane were each added to oxygen simultaneously at a flow rate equal to 0.33% or 1% of the oxygen flow rate.

A linear regression was performed on the data, resulting in a set of equations that express the time to strip photoresist from the wafer (in minutes) as a function of implanted metal species dosage level, oxygen flow rate, reactor pressure, and concentration of gases added to the oxygen gas. The time to strip photoresist from the wafer was calculated by multiplying the dose level, O$_2$ flow rate, pressure, or SF$_6$ or isobutane % of O$_2$ flow rate by the corresponding slope (M) of the line generated by the linear regression and adding the corresponding intercept of the line (B). The time to strip arsenic-implanted photoresist for different test conditions is listed in Table 2.

TABLE 2

ARSENIC

| Line | | COMPARATIVE PROCESS SF$_6$ + O$_2$ | | | PROCESS OF THIS INVENTION SF$_6$ + ISOBUTANE + O$_2$ | | |
|---|---|---|---|---|---|---|---|
| | | M | B | TIME TO CLEAR (min.) | M | B | TIME TO CLEAR (min.) |
| 1 | DOSE LEVELS (atoms/cm$^2$) | 1.390E − 16 | 1.423 | | 7.675E − 17 | 2.399 | |
| 2 | 5.00E + 14 | " | " | 1.49 | " | " | 2.44 |
| 3 | 1.00E + 15 | " | " | 1.45 | " | " | 2.48 |
| 4 | 5.00E + 15 | " | " | 2.12 | " | " | 2.78 |
| 5 | 1.00E + 16 | " | " | 2.81 | " | " | 3.17 |
| 6 | O$_2$ FLOW RATE (sccm) | −7.222E − 05 | 2.394 | | −1.542E − 04 | 3.188 | |
| 7 | 2000 | " | " | 2.25 | " | " | 2.88 |
| 8 | 3000 | " | " | 2.18 | " | " | 2.73 |
| 9 | PRESSURE (torr) | −0.722 | 2.539 | | 0.308 | 2.571 | |
| 10 | 0.5 | " | " | 2.18 | " | " | 2.73 |
| 11 | 1 | " | " | 1.82 | " | " | 2.88 |
| 12 | SF$_6$ or ISOBUTANE FLOW RATE, % OF O$_2$ FLOW RATE | | | | .0392 | 3.063 | |
| 13 | 0.33 | — | — | — | " | " | 2.93 |
| 14 | 1.0 | — | — | — | " | " | 2.67 |

The information in Table 2 shows that this invention provides a way to strip photoresist within a short time period. Although the time required by this invention is longer than the time required by the particular Comparative Process of this Example, the time required by this invention is still quite short when compared to other prior-art processes, some of which were discussed above. What is especially surprising about the data is that the difference in time between this invention and the Comparative Process is only about 1 minute or less, especially at high implant dosages.

Selectivity of Photoresist Strip to Oxide Etch

Information for oxide etch rate and time to strip photoresist given in the Tables above was used to estimate the amount of exposed oxide that would be etched from a substrate during photoresist stripping. Table 3 summarizes this information.

TABLE 3

| | OXIDE ETCH RATE (Å/min.) | TIME TO STRIP PHOTORESIST (min.) | TOTAL OXIDE ETCHED DURING PHOTORESIST STRIP (Å) |
|---|---|---|---|
| Comp. Ex. A | 28 | — | — |
| Table 2 Line 8 | — | 2.18 | — |
| Comparative | — | — | 61.04 |

TABLE 3-continued

|  | OXIDE ETCH RATE (Å/min.) | TIME TO STRIP PHOTORESIST (min.) | TOTAL OXIDE ETCHED DURING PHOTORESIST STRIP (Å) |
| --- | --- | --- | --- |
| Ex. 2 | 3 | — | — |
| Table 2 Line 13 | — | 2.93 | — |
| This Invention | — | — | 8.79 |

Table 3 shows that substantial etching of exposed oxide would occur during photoresist stripping for the Comparative Process, while relatively little oxide etching would occur for this invention. Further, various photoresist strip to oxide etch selectivities were calculated for conditions represented by the Comparative Examples and Examples of this invention. These results are summarized in Table 4 below.

TABLE 4

| PHOTORESIST | | OXIDE | SELECTIVITY | |
| --- | --- | --- | --- | --- |
| LAYER THICKNESS, microns | STRIP RATE, Å/min. | ETCH RATE, Å/min. | COMPARATIVE EXAMPLES | EXAMPLES OF THIS INVENTION |
| 1.2 | 4270 | 28 | 153 | — |
| 1.2 | 5505 | 28 | 197 | — |
| 1.2 | 6593 | 28 | 235 | — |
| 1.2 | 8054 | 28 | 288 | — |
| 1.0 | 3785 | 5 | — | 631 |
| 1.2 | 4918 | 5 | — | 984 |
| 1.2 | 4096 | 2 | — | 2048 |
| 1.2 | 4918 | 2 | — | 2459 |

Table 4 shows that strip to oxide removal selectivity is quite high for various embodiments of this invention. Consequently, photoresist can be removed preferentially, leaving exposed $SiO_2$ essentially intact.

The examples and information in the Tables above illustrate how various embodiments of this invention provide a way to remove photoresist from a wafer while leaving exposed oxide essentially intact. This invention therefore provides for more accurate fabrication of semiconductor devices where oxide is used to make circuits on the surface of a chip, or where oxide is used to mask underlying silicon to prevent etching in later processing steps. Consequently, the combination of fast processing time and high selectivity of photoresist strip to oxide etch in these examples of the invention provides significantly better control over semiconductor or microelectromechanical device fabrication.

Descriptions of specific examples, designs, and dimensions are provided only to illustrate preferred embodiments of the invention. It is to be understood that various modifications to the preferred embodiments will be readily apparent to those skilled in the art. Thus, while preferred embodiments of the invention have been disclosed, it will be readily apparent to those skilled in the art that the invention is not limited to the disclosed embodiments but, on the contrary, the invention is intended to cover numerous other modifications and broad equivalent arrangements that are included within the spirit and scope of the following claims.

What is claimed is:

1. A process for removing hardened or implanted photoresist from a silicon wafer comprising
  a. placing the silicon wafer having hardened or implanted photoresist and oxide thereon into the wafer processing chamber of a plasma-generating reactor;
  b. forming reactive species by generating a plasma of a gas comprising oxygen, a halogen-containing compound, and a hydrocarbon under conditions capable of causing undesired etching of the oxide in the absence of the hydrocarbon, wherein the reactive species include ions formed from the hydrocarbon;
  c. exposing the surface of the silicon wafer to reactive species from the plasma, including at least some of the ions formed from the hydrocarbon: and
  d. maintaining the flow of the hydrocarbon such that the selectivity of etching of the photoresist relative to the oxide is substantially increased over the selectivity that would exist in the absence of the hydrocarbon.

2. The process of claim 1 wherein the fluorine-containing compound and hydrocarbon are present in the plasma in amounts sufficient that gases formed below the surface of the photoresist during stripping diffuse out of the photoresist at a rate which provides a gas pressure within the photoresist that is less than the gas pressure which causes photoresist popping.

3. The process of claim 1 wherein the energy of the plasma and the oxygen, fluorine-containing compound, and hydrocarbon are selected to produce an amount and type of reactive species sufficient that gases formed below the surface of the photoresist during stripping diffuse out of the photoresist at a rate which provides a gas pressure within the photoresist that is less than the gas pressure which causes photoresist popping.

4. The process of claim 1 wherein the halogen-containing compound comprises $SF_6$.

5. The process of claim 1 wherein the hydrocarbon is an aliphatic hydrocarbon.

6. The process of claim 1 wherein the hydrocarbon is substituted.

7. The process of claim 1 wherein the hydrocarbon comprises an alkane.

8. The process of claim 1 wherein the hydrocarbon comprises isobutane.

9. The process of claim 1 wherein the oxide is exposed on a surface of the substrate.

10. The process of claim 1 wherein the amount of hydrocarbon in the gas is effective to increase the selectivity of etching of the photoresist relative to the oxide to at least five hundred.

11. A process for removing photoresist from a substrate comprising
  a. providing a substrate having photoresist and oxide:
  b. forminig reactive species by generating a plasma of a gas comprising an oxidizing gas, a halogen-containing compound, and less than about five percent hydrocarbon under conditions capable of causing undesired etching of the oxide in the absence of the hydrocarbon;
  c. exposing the substrate to reactive species from the plasma;
  d. removing at least a portion of the photoresist from the substrate; and
  e. maintaining the flow of the hydrocarbon such that the selectivity of etching of the photoresist relative to the oxide is substantially increased over the selectivity that would exist in the absence of the hydrocarbon.

12. The process of claim 11 wherein the gas that releases hydrogen comprises an alkane.

13. The process of claim 1 wherein the step of forming reactive species further comprises the step of maintaining a low energy plasma such that the ions formed from the hydrocarbon include intermediate species containing both hydrogen and carbon; and wherein the step of exposing the surface of the silicon wafer further comprises the step of exposing the surface of the wafer to at least some of the intermediate species.

14. The process of claim 13 wherein the step of maintaining a low energy plasma further comprises the step of inductively coupling power into the plasma.

15. The process of claim 14 wherein the step of maintaining a low energy plasma further comprises the step of shielding the plasma with a split Faraday shield.

16. The process of claim 1, wherein the selectivity of the photoresist relative to the oxide is greater than 1000.

17. The process of claim 1 wherein the selectivity of the photoresist relative to the oxide is more than twice the selectivity that would exist in the absence of the hydrocarbon.

18. The process of claim 1 wherein the flow rate of the oxygen is greater than 1,000 SCCM.

19. The process of claim 1 wherein the flow rate of oxygen is greater than 2,000 SCCM.

20. The process of claim 1 wherein the flow rate of the hydrocarbon is less than about five percent of the flow rate of the oxidizing gas.

21. The process of claim 1 wherein the flow rate of the hydrocarbon is less than about one percent of the flow rate of the oxidizing gas.

22. The process of claim 1 wherein the flow rate of the halogen-containing compound is less than about five percent of the flow rate of the oxidizing gas.

23. The process of claim 1 further comprising the step of maintaining the temperature of a support for the wafer at substantially less than 150 degrees Celsius.

24. The process of claim 1 further comprising the step of maintaining the temperature of a support for the wafer at less than about 75 degrees Celsius.

25. The process of claim 11 wherein the step of forming reactive species by generating a plasma further comprises the step of inductively coupling power into the plasma.

26. The process of claim 11 wherein the selectivity of the photoresist relative to the oxide is greater than 1000.

27. The process of claim 11, wherein the selectivity of the photoresist relative to the oxide is more than twice the selectivity that would exist in the absence of the hydrocarbon.

28. The process of claim 11 wherein the flow rate of the oxygen is greater than 1,000 SCCM.

29. The process of claim 11 wherein the flow rate of the hydrocarbon is less than about one percent of the flow rate of the oxidizing gas.

30. The process of claim 11 further comprising the step of maintaining the temperature of a support for the wafer at substantially less than 150 degrees Celsius.

31. The process of claim 11 wherein the hydrocarbon contains only hydrogen and carbon.

32. The process of claim 11, wherein the hydrocarbon comprises isobutane.

33. A process for removing photoresist from a substrate comprising a. providing a substrate having photoresist and oxide;

b. forming reactive species by generating a plasma of a gas comprising an oxidizing gas, a halogen-containing compound, and a hydrocarbon having at least three carbon atoms under conditions capable of causing undesired etching of the oxide in the absence of the hydrocarbon;

c. exposing the substrate to reactive species from the plasma;

d. removing at least a portion of the photoresist from the substrate; and e. maintaining the flow of the hydrocarbon such that the selectivity of etching of the photoresist relative to the oxide is substantially increased over the selectivity that would exist in the absence of the hydrocarbon.

34. The process of claim 33 wherein the step of forming reactive species by generating a plasma further comprises the step of forming ions; and wherein the step of exposing the substrate to reactive species from the plasma further comprises the step of exposing the photoresist to at least some of the ions.

35. The process of claim 33 wherein the flow rate of the hydrocarbon is less than about five percent of the flow rate of the oxidizing gas.

36. The process of claim 33 wherein the hydrocarbon contains only hydrogen and carbon.

37. The process of claim 33 wherein the hydrocarbon comprises isobutane.

38. The process of claim 34 wherein the flow rate of the hydrocarbon is less than about five percent of the flow rate of the oxidizing gas.

39. The process of claim 1 further comprising the step of etching the photoresist at a rate of at least about 0.3 microns per minute.

40. The process of claim 11 further comprising the step of etching the photoresist at a rate of at least about 0.3 microns per minute.

41. The process of claim 33 further comprising the step of etching the photoresist at a rate of at least about 0.3 microns per minute.

* * * * *